United States Patent [19]

Casey

[11] Patent Number: 4,700,365

[45] Date of Patent: Oct. 13, 1987

[54] DIGITAL THRESHOLD DETECTOR WITH HYSTERESIS

[75] Inventor: Robert F. Casey, Oradell, N.J.

[73] Assignee: RCA Corporation, Princeton, N.J.

[21] Appl. No.: 791,489

[22] Filed: Oct. 25, 1985

[51] Int. Cl.[4] ...................... H04L 25/06; H04L 25/10

[52] U.S. Cl. ...................................... 375/76; 307/359

[58] Field of Search ................ 375/24, 25, 76; 370/6; 307/356, 357, 358, 359

[56] References Cited

U.S. PATENT DOCUMENTS

| | | | |
|---|---|---|---|
| 3,758,868 | 9/1973 | Brown | 307/359 |
| 3,784,921 | 1/1974 | Iadipaolo | 328/135 |
| 3,828,204 | 8/1984 | Farnsworth | 307/359 |
| 4,007,382 | 2/1977 | Warberg | 307/359 |
| 4,100,532 | 7/1978 | Farnbach | 340/146.3 |
| 4,291,355 | 9/1981 | Dinger | 361/31 |
| 4,326,168 | 4/1982 | Acker | 328/162 |
| 4,387,465 | 2/1984 | Dolikian | 307/358 |
| 4,387,465 | 6/1983 | Becker | 375/76 |
| 4,407,020 | 9/1983 | Helliwell et al. | 375/27 |
| 4,525,638 | 6/1985 | Gray | 307/350 |
| 4,602,374 | 7/1986 | Nakamura et al. | 375/76 |

*Primary Examiner*—Robert L. Griffin
*Assistant Examiner*—Stephen Chin
*Attorney, Agent, or Firm*—Paul J. Rasmussen; Eric P. Herrmann; Dilip A. Kulkarni

[57] ABSTRACT

As the 8-bit input signal applied to a threshold device reaches a first threshold level, the 1-bit output signal changes from a logical zero to a logical one. The 1-bit output signal is delayed by one system clock period and fed back. The delayed 1-bit output signal is combined (e.g., merged or added) with the 8-bit input signal, and the resulting signal is applied to the threshold device to provide a hysteresis feature. Once the delayed 1-bit output signal becomes a logical one, the input signal has to drop below a second, lower threshold level before the 1-bit output signal can revert back to a logical zero, whereby a margin of noise immunity is provided.

10 Claims, 6 Drawing Figures

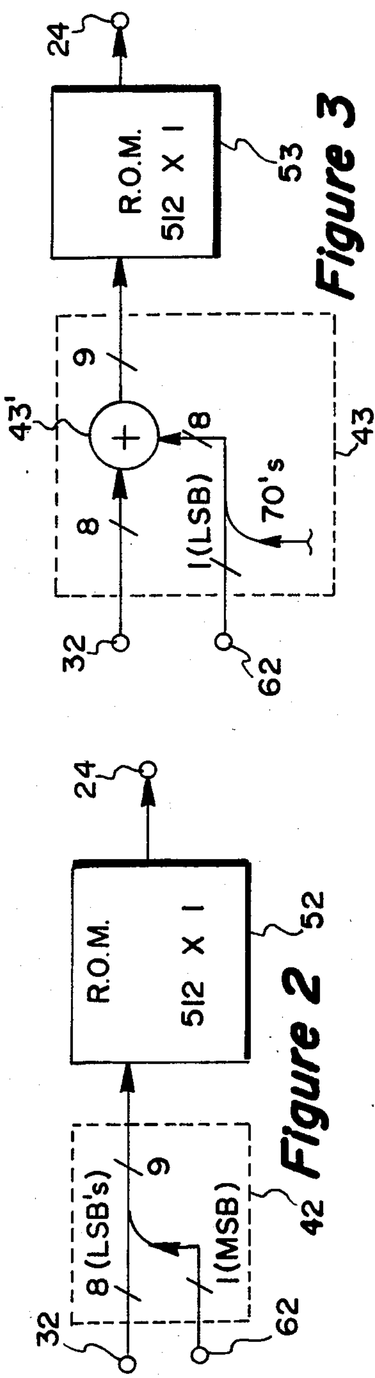
Figure 2
Figure 3
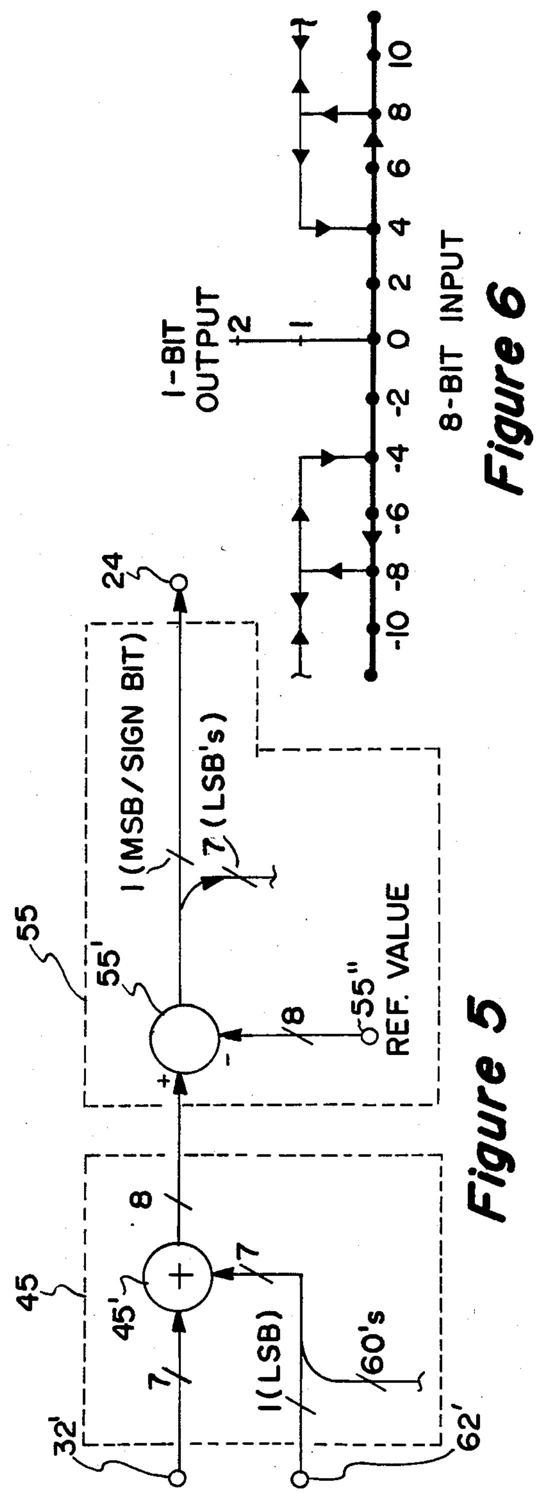
Figure 5
Figure 6

DIGITAL THRESHOLD DETECTOR WITH HYSTERESIS

This invention relates to a digital threshold detection circuit having a hysteresis feature.

BACKGROUND OF THE INVENTION

In the field of television, considerable efforts have been directed toward developing a digital television receiver wherein the signals are processed by digital circuitry. A motivation for these efforts comes from the fact that the digital television can offer a number of novel features—such as still picture display, multipicture display, direct hookup to a satellite dish amplifier, etc.

There is a continuing desire in the television industry to improve the signal-to-noise ratio (S/N ratio) of the video signals. There are techniques for improving the S/N ratio which take advantage of the fact that video signals are periodic, whereas the noise is aperiodic. Successive addition or signal averaging of the video signals tends to reinforce the periodic signal components, but it tends to cancel out the aperiodic noise components, whereby the S/N ratio is improved. The signal averaging techniques perform well when the television picture is relatively stationary. However, when significant motion is present in the scene, signal averaging causes degradation of the reproduced image—e.g., comet tails.

U.S. patent application, Ser. No. 702,612, filed in behalf of Fling, and entitled "VIDEO SIGNAL RECURSIVE FILTER ADAPTIVELY CONTROLLED RESPONSIVE TO THE HISTORY OF IMAGE MOTION", discloses one technique for dealing with the problem of image motion. The Fling apparatus includes a recursive filter wherein current and stored video signals (which are delayed by one frame period) are proportioned and summed as a function of interimage motion to generate noise reduced video signals. The recursive filter includes a motion detector and an auxiliary frame memory for storing the motion signal at the output of the motion detector. A logic device, responsive to the current and stored motion signal, selects predetermined scale factors (e.g., 1, $\frac{1}{2}$ and $\frac{1}{8}$) for proportioning the current and delayed video signals.

Typically, the motion detector includes a subtracter for subtracting the stored video signal from the incoming video signal to generate a difference signal. The difference signal, which represents frame-to-frame image motion, is applied to a threshold detector for developing a 1-bit motion signal. The motion signal is a logical zero and a logical one depending upon whether or not the difference signal is less than a threshold level. As previously indicated, the motion signal determines the scale factors used for proportioning the current and delayed video signals in noise reduction systems.

A problem with a motion detector without hysteresis is that when the average difference signal is at or near the threshold level, unwanted signal excursions—such as those produced by noise—cause the detector to switch between the output states, thereby resulting in a spurious motion signal.

SUMMARY OF THE INVENTION

In accordance with the present invention, a novel digital threshold detector is provided with a hysteresis feature, whereby a definite switching point is achieved without sacrificing noise immunity. The subject digital threshold detector includes a combining means and a threshold device. When an n-bit digital input signal (e.g., 8-bit difference signal) reaches a first threshold level, a 1-bit output signal (e.g., 1-bit motion signal) from the threshold device goes from a logical zero to a logical one. The 1-bit output signal is combined with the n-bit input signal, and the combined input signal is applied to the threshold device to produce a positive hysteresis effect on the output signal. The combination of the output signal with the input signal serves to define a lower, second threshold level when the output signal is a logical one. Thus, once the input signal reaches the first threshold level and triggers a logical one output signal, the input signal has to drop below the lower, second threshold level before the output signal is allowed to go back to a logical zero. Noise not large enough to drive the input signal from near the first theshold level to the lower, second threshold level is prevented from toggling the threshold detector back and forth, thereby achieving noise immunity.

Pursuant to one aspect of the present invention, the 1-bit output signal is merged with the n-bit input signal to generate a combined input signal in which the most significant bit (MSB) represents the 1-bit output signal, and the remaining bits represent the n-bit input signal.

According to another feature of the instant invention, the 1-bit output signal is algebraically added to the n-bit input signal to generate the aforesaid combined input signal.

In accordance with a still further aspect of this invention, the threshold device is a read-only-memory (ROM) responsive to the combined input signal, and programmed to define the first and second threshold levels respectively.

According to yet another aspect of the present invention, the threshold device comprises a subtracter for subtracting a reference value from the combined input signal to generate a difference signal, in which the sign bit (or the MSB) defines the 1-bit output signal.

BRIEF DESCRIPTION OF THE DRAWINGS

FIGS. 2–5 show alternative embodiments of the FIG. 1 threshold detector; and

FIG. 6 is a graphical representation of the illustrative threshold levels employed in the FIG. 2 embodiment.

DESCRIPTION OF THE PREFERRED EMBODIMENTS

Figure 1:
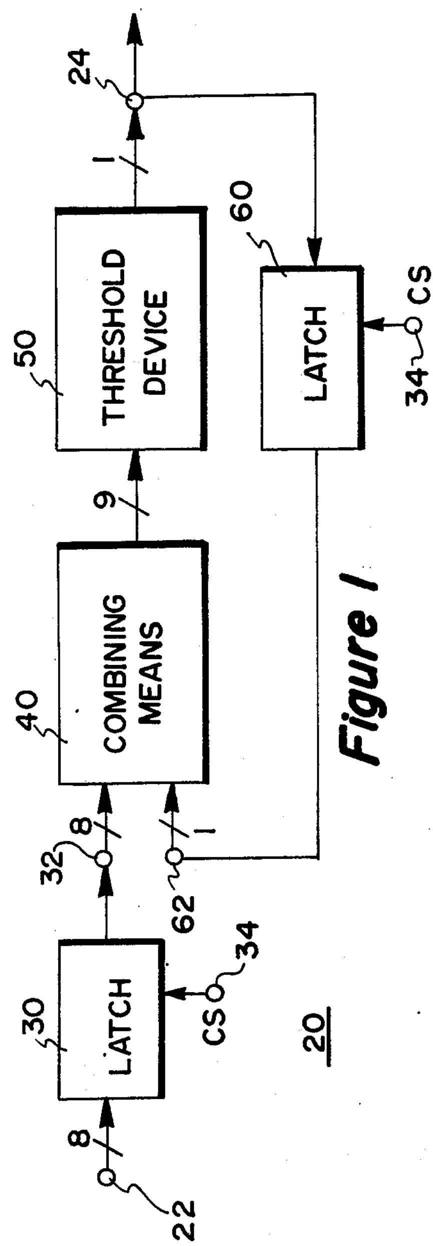
FIG. 1 illustrates a schematic block diagram of a threshold detector having a hysteresis feature in accordance with the present invention.

In the exemplary embodiments of the subject invention described hereinbelow, it is assumed that the input signal to be threshold tested is a sequence of 8-bit binary samples of parallel bits occurring synchronously with and at the same rate as a main clock signal. The output signal is a sequence of 1-bit binary samples occurring synchronously with and at the same rate as the 8-bit input signal.

Unless otherwise indicated, it is assumed that the 8-bit input signal samples are in two's complement binary number system. In the two's complement binary number system, the MSB defines the sign of the numbers. When the MSB is a logical zero and a logical one respectively, the binary numbers are positive and negative.

In the drawings, the interconnections between the various blocks are parallel multiwire connections with the number of conductors being indicated by a numeral next to the slash mark.

FIG. 1 is a block diagram of a digital threshold detector 20 with a hysteresis feature pursuant to this invention. The threshold detector 20 receives the 8-bit input signal on an input terminal 22 and develops the 1-bit output signal on an output terminal 24. The threshold detector 20 consists of a combining means 40 and a threshold device 50. The 1-bit output signal from the threshold device 50 is delayed by one clock cycle and fed back as one of the two inputs to the combining means 40 to provide a hysteresis effect on the output signal. The combining means 40 combines the 8-bit input signal with the delayed, 1-bit output signal to generate a 9-bit combined input signal. The 9-bit combined input signal is fed to the threshold device 50.

In order to synchronize the two inputs to the combining means 40, a pair of latches 30 and 60 are provided. The latches 30 and 60 simultaneously apply the respective samples of the 8-bit input signal and the delayed, 1-bit output signal to terminals 32 and 62 in response to the clock signal (CS). The source of the clock signal CS is indicated by a numeral 34. The latch 60 additionally serves to delay the 1-bit output signal by one clock cycle before it is applied to the terminal 62.

When the value of the 8-bit input signal increases to a first threshold level, the 1-bit output signal of the threshold device 50 changes from a logical zero to a logical one. The logical one output signal from the threshold device 50 is delayed by one clock cycle, and combined (e.g., merged or added) with the 8-bit input signal. The combination of the 8-bit input signal with the delayed, 1-bit output signal serves to define a lower, second threshold level in the manner explained in conjunction with FIGS. 2–5. Thus, once the delayed 1-bit output signal from the threshold device 50 becomes a logical one, the 8-bit input signal must drop below the lower, second threshold level before the output signal of the threshold device can revert back to a logical zero. Noise amplitudes less than the difference between the first threshold level and the second, lower threshold level will not affect the output of the threshold device 50, thereby providing a margin of noise immunity.

FIGS. 2–5 illustrate various alternative implementations of the threshold detector 20. As previously indicated, the 8-bit input signal is assumed to be in two's complement binary number system. In the FIG. 2 embodiment, the delayed, 1-bit output signal and the 8-bit input signal are concatenated to from a 9-bit combined input signal in which the MSB and the 8 LSB's respectively represent the output signal and input signal. The 9-bit combined input signal defines a 9-bit address codeword and is applied to the address input port of the random access memory (ROM) 52 having 512 (or $2^9$) memory locations for storing the respective 1-bit output signal values.

The ROM 52 is programmed to provide a zero output value for all of the 8 LSB address codewords (i.e., the input signal values) occurring between ± the first threshold level and to provide a one output value for all other 8 LSB address codewords, when the 9th MSB (i.e., the delayed 1-bit output signal) is a logical zero. The ROM 52 is further programmed to provide a zero output value for all of the 8 LSB address codewords defining values between ± the second threshold level and to provide a one output value for all other 8 LSB address codewords, when the 9th MSB is a logical one. This program, in part, is illustrated in TABLE 1. All of the 8 LSB address codewords which produce zero output states for this example are illustrated in the table.

This table is developed assuming that both the positive and negative 2's complement input signal values will be applied to the ROM 52. If, however, only the magnitudes of the input signal will be included in the input address codewords, the ROM 52 can be halved, and all of the values (memory locations and address values) corresponding to the negative address codewords may be eliminated.

TABLE 1

| 9-BIT ADDRESS | | | | |
|---|---|---|---|---|
| 9th MSB | 8 LSB ADDRESS CODE WORDS | 8-BIT DECIMAL EQUIVALENT | 9th MSB=0 ROM OUTPUT | 9th MSB=0 ROM OUTPUT |
| X | 0111 111 | +127 | 1 | 1 |
| X | ... | ... | 1 | 1 |
| X | 0000 1010 | +10 | 1 | 1 |
| X | 0000 1001 | +9 | 1 | 1 |
| X | 0000 1000 | +8 | 1* | 1 |
| X | 0000 0111 | +7 | 0 | 1 |
| X | 0000 0110 | +6 | 0 | 1 |
| X | 0000 0101 | +5 | 0 | 1** |
| X | 0000 0100 | +4 | 0 | 0 |
| X | 0000 0011 | +3 | 0 | 0 |
| X | 0000 0010 | +2 | 0 | 0 |
| X | 0000 0001 | +1 | 0 | 0 |
| X | 0000 0000 | 0 | 0 | 0 |
| X | 1111 1111 | −1 | 0 | 0 |
| X | 1111 1110 | −2 | 0 | 0 |
| X | 1111 1101 | −3 | 0 | 0 |
| X | 1111 1100 | −4 | 0 | 0 |
| X | 1111 1011 | −5 | 0 | 1** |
| X | 1111 1010 | −6 | 0 | 1 |
| X | 1111 1001 | −7 | 0 | 1 |
| X | 1111 1000 | −8 | 1* | 1 |
| X | 1111 0111 | −9 | 1 | 1 |
| X | ... | ... | 1 | 1 |
| X | 1000 0000 | −128 | 1 | 1 |

*first threshold value (input signal = ± 8)
**second threshold value (input signal = ± 5)

From FIG. 6 and TABLE 1, it can be seen that the output signal remains a logical zero as long as the input signal is less than the first threshold level 0000 1000 (or 8). When the input signal reaches the first threshold level, the output signal changes to a logical one.

The logical one output signal is delayed for one clock cycle by the latch 60, and the delayed output signal is applied to the combining means 42. The combining means 42 concatenates the delayed, 1-bit output signal with the 8-bit input signal to generate the 9-bit combined input signal, in which the MSB is the delayed, 1-bit output signal. Once the MSB of the 9-bit combined input signal goes to a logical one, it will be seen from FIG. 6 and TABLE 1 that the input signal must drop below the second threshold level 0000 0101 (or 5) before the output signal can revert back to a logical zero, thereby providing noise immunity. Noise insufficient to drive the input signal below the second, lower threshold level (i.e., 0000 0101 or 5) is not allowed to pass through once the delayed output signal becomes a logical one. It will be seen that the system response is symmetrical about a zero input value.

The actual values of the first and second threshold levels are determined by considerations such as noise immunity and input signal sensitivity. Basically, the higher the difference between the two threshold levels, the greater the noise immunity and the smaller the sensitivity of the threshold detector 20 to the changes in the input signal.

FIG. 3 illustrates another embodiment of the present invention. In FIG. 3, the 8-bit input signal is applied to one input port of an adder 43' and the delayed, 1-bit output signal is coupled to the LSB position of a second input port thereof. The adder 43' produces a 9-bit output which is applied to the address port of a ROM 53. The 512×1-bit ROM 53 is programmed to define a double threshold window which may correspond to TABLE 1. The 1-bit output signal from the ROM 53 is delayed by one clock cycle, and added to the 8-bit input signal to provide hysteresis.

Adding the delayed, 1-bit output signal to the least significant bit position of the 8-bit input signal raises the address codeword by one unit. Therefore the input signal must go through a transition of at least two units before the output can change states once it has gone through the first threshold value. It will be recognized by those skilled in the art that the 1-bit output signal may be added to a more significant position of the 8-bit input signal (e.g., 3rd LSB position) to generate a larger difference (e.g., 4 levels) between the two threshold levels.

Figure 4:
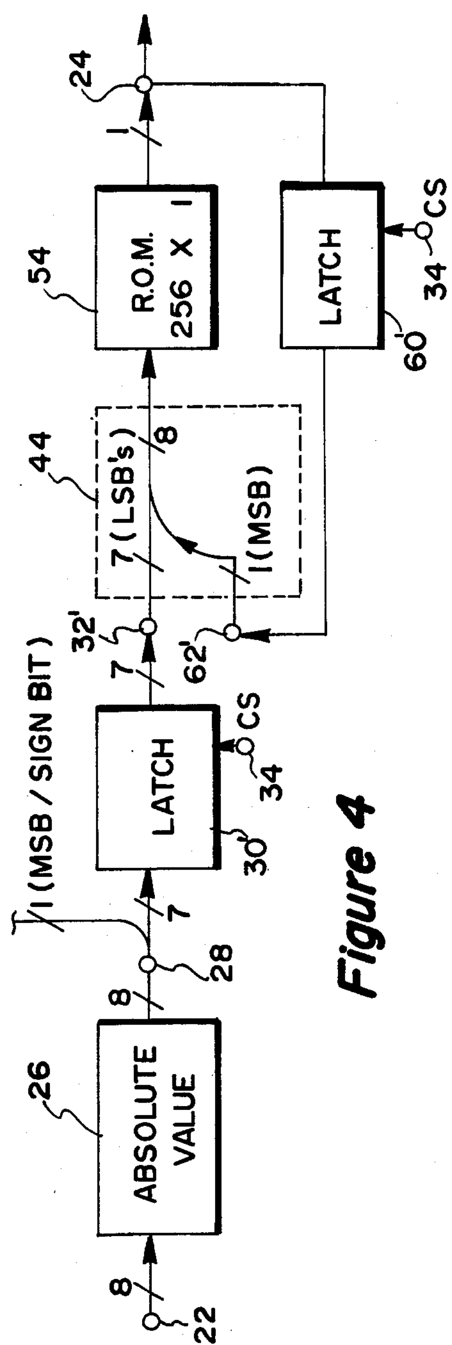

FIG. 4 represents a still further embodiment of the present invention. The 8-bit input signal in two's complement binary number system is applied to an absolute value determining means 26. The MSB or the sign bit of the absolute values at the output 28 of the absolute value determining means 26, being redundant, is ignored. The 7 LSB's of the absolute values on the terminal 32' are merged with the delayed, 1-bit output signal on the terminal 62', and the resulting 8-bit combined input signal is applied to a ROM 54 with 256 (or $2^8$) memory locations for storing the respective 1-bit output signal values. The 256×1-bit ROM 54 in this arrangement is programmed with a single threshold window corresponding to TABLE 1, with the 9th MSB=0.

FIG. 5 depicts still another variation of the FIG. 4 embodiment of the present invention. An adder 45' adds the delayed, 1-bit output signal to the LSB position of the 7-bit input signal on the terminal 32' to generate an 8-bit combined input signal in a manner similar to that shown in FIG. 3. The output of the adder 45' is applied to the minuend terminal of a subtracter 55'. The subtracter 55' subtracts an 8-bit reference or threshold value from the 8-bit combined input signal from the adder 45' to generate an 8-bit difference signal. The MSB (or the sign bit) of the 8-bit difference signal at the output of the subtracter 55' defines the 1-bit output signal. The 1-bit output signal is delayed, and fed back to the adder 45' to provide hysteresis.

It will be obvious to people skilled in the art that many other embodiments of the invention can be conceived without departing from the scope thereof. For example, the function of the threshold means can be realized with the help of hardware (i.e., logic gates) instead of a ROM. In addition, the 1-bit output signal may be concatenated at other than the MSB position of the combined input signal (e.g., at the LSB position thereof) with appropriate programming of the ROM. Such alternative arrangements are intended to be covered by the appended claims.

What is claimed is:

1. A digital threshold detector with hysteresis comprising:

a source of a digital input signal;

a digital threshold means for producing a digital output signal having first and second logic states depending upon the value of the input to said threshold means; and means coupled to said input signal source and said threshold means for combining said digital input signal with said digital output signal to generate a digital combined input signal for application to said digital threshold means; the combination of said digital input signal with said digital output signal effectively changing the input signal level at which said digital threshold detector changes output states; said digital threshold means changing output states when said digital input signal exceeds a first or a second threshold level depending upon whether said digital output signal is in said first or said second logic state respectively.

2. The digital threshold detector as defined in claim 1 wherein said combining means concatenates a 1-bit output signal with an n-bit input signal to generate an n+1 bit combined input signal.

3. The digital threshold detector set forth in claim 1 wherein said digital threshold means comprises a random access memory (ROM) having an address input port coupled to said combining means and programmed to output said first state for an n-bit input signal having values less than a first threshold value and to output said second state for input values greater than said first threshold value for said output signal exhibiting said first sate, and further programmed to output said first state for said n-bit input signal values less than a second threshold value and to output said second state for input values greater than said second threshold value for said output signal exhibiting said second state.

4. The digital threshold detector as defined in claim 1 further including a source of a clock signal occurring synchronously with and at the same rate as said digital input signal; said detector additionally having a latch coupled to the output of said threshold means and clocked by said clock signal for supplying said output signal to said combining means.

5. The digital threshold detector as defined in claim 4 further including another latch coupled between said source of said digital input signal and said combining means.

6. The digital threshold detector as defined in claim 1 wherein said combining means includes an adder having a first input port coupled to said input signal source and a second input port coupled to receive a 1-bit output signal for adding said 1-bit output signal to a predetermined bit position of said input signal.

7. The binary digital threshold detector as defined in claim 6 wherein said 1-bit output signal is added to the least significant bit (LSB) position of said input signal.

8. The digital threshold detector as defined in claim 7 wherein said threshold means comprises a read-only-memory having an address input port coupled to the output of said adder.

9. A digital threshold detector with hysteresis comprising:

a source of an n-bit digital input signal; wherein said digital input signal consists of a sequence of either all positive or all negative n-bit binary samples in two's complement binary number system;

a threshold means for producing a 1-bit digital output signal having first and second logic states depending upon the value of the input to said threshold means; and means coupled to said input signal source and said threshold means for combining said n-bit input signal with said 1-bit output signal to generate a combined input signal for application to said threshold means; the combination of said n-bit input signal with said 1 bit output signal effectively changing the input signal level at which said threshold detector changes output states between a first threshold level and a second threshold level depending upon whether said output signal is in said first or said second logic states respectively;

wherein said combining means concatenates said 1-bit output signal with the $n-1$ least significant bits (LSB's) of said input signal to generate an n-bit combined input signal; wherein said threshold means comprises a read-only-memory (ROM) having $2^n$ memory locations addressed by said n-bit combined input signal; wherein a first group of $2^{n/2}$ memory locations defines said first threshold level in response to said output signal having said first logic state; wherein the remaining $2^{n/2}$ memory locations define said second threshold level in response to said output signal having said second logic state.

10. The digital threshold detector as defined in claim 1 wherein said digital input signal consists of a sequence of either all positive or all negative n-bit binary samples in two's complement binary number system; wherein said combining means consists of an adder having a first input port coupled to the $n-1$ least significant bits (LSB's) of said input signal and a second input port coupled to receive a 1-bit output signal for adding said 1-bit output signal to a predetermined bit position of said $n-1$ LSB's of said input signal; wherein said threshold means comprises a subtracter and a reference value generating means; wherein the minuend and subtrahend terminals of said subtracter are respectively coupled to an output of said adder and to said reference value generating means to provide a difference signal including a polarity representative signal defining said 1-bit output signal.

* * * * *